United States Patent [19]

Lockwood et al.

[11] 4,092,561
[45] May 30, 1978

[54] STRIPE CONTACT PROVIDING A UNIFORM CURRENT DENSITY

[75] Inventors: Harry Francis Lockwood, New York, N.Y.; Henry Kressel, Elizabeth, N.J.

[73] Assignee: RCA Corporation, New York, N.Y.

[21] Appl. No.: 615,682

[22] Filed: Sep. 22, 1975

[51] Int. Cl.² .............................................. H01J 1/62
[52] U.S. Cl. ...................................... 313/499; 357/20
[58] Field of Search ...................... 357/17, 20; 313/499

[56] References Cited

U.S. PATENT DOCUMENTS

| 3,309,553 | 3/1967 | Kroemer | 357/17 |
| 3,683,240 | 8/1972 | Pankove | 357/17 |
| 3,821,774 | 6/1974 | Beale | 357/17 |

*Primary Examiner*—Rudolph V. Rolinec
*Assistant Examiner*—Michael J. Tokar

*Attorney, Agent, or Firm*—H. Christoffersen; B. E. Morris

[57] ABSTRACT

A semiconductor electroluminescent device includes a body having a pair of spaced end surfaces, at least one of which is capable of emitting light generated in the body and a recombination region in the body extending from one end surface to the other end surface. The body also includes a pair of spaced contacting surfaces which are approximately perpendicular to the end surfaces. On one of the contacting surfaces is a stripe contact which includes a plurality of spaced, parallel electrically conductive sub-stripes extending from one of the end surfaces to the other end surface with insulation between the sub-stripes. The sub-stripes may be conductive films on the surface of the body or conductive regions within the body. The width of the sub-stripes and the spacing therebetween along the end surfaces, are such that the stripe contact provides a substantially uniform current density at the recombination region of the device.

6 Claims, 4 Drawing Figures

STRIPE CONTACT PROVIDING A UNIFORM CURRENT DENSITY

BACKGROUND OF THE INVENTION

The present invention relates to stripe electrical contacts on electroluminescent semiconductor devices and more specifically to stripe electrical contacts providing uniform current density in an electroluminescent semiconductor device.

It is well known in the field of electroluminescent semiconductor devices such as lasers and light emitting diodes (LED) to use stripe contacts to restrict the current flow to only a portion of the device. Thus, the light emission will come from only a small portion of the device's emitting surface. Typically, the stripe contact extends across a surface of the device approximately perpendicular to the emitting surface. The pattern of current flowing from the stripe contact usually flares out as the current flows away from the stripe contact. How much the current pattern flares out is dependent on the conductivity of the semiconductor material of the device and the geometry of the contact. However, the current density along the current flow pattern from one flared side to the opposite flared side is not uniform. The current density is highest in the center of the current flow pattern, i.e., directly under the center of the stripe contact, and continues to decrease moving out toward the flared sides of the current flow pattern.

This non-uniformity of the current density in the recombination region of a semiconductor laser or LED results in non-uniform radiation generation in the semiconductor device. Also, non-uniform current density caused non-uniform heating in the recombination region of the semiconductor device, reducing efficiency and device lifetime. Therefore, it would be most desirable in the field of semiconductor lasers and LED's to have a stripe contact which can provide a pattern of current flow of a uniform current density in the recombination region.

SUMMARY OF THE INVENTION

An electroluminescent semiconductor device includes a body of semiconductor material having opposed parallel end surfaces and opposed side surfaces. The body also includes a pair of spaced contacting surfaces substantially perpendicular to the end surfaces, and a recombination region in which radiation can be generated. A stripe contact is at one of the contacting surfaces having a plurality of spaced, parallel sub-stripes individually contacting the body. The sub-stripes extend from one end surface to the other. The width and spacing between the sub-stripes along the end surface is such as to provide a substantially uniform current density through the recombination region.

DETAILED DESCRIPTION OF THE INVENTION

Figure 1:
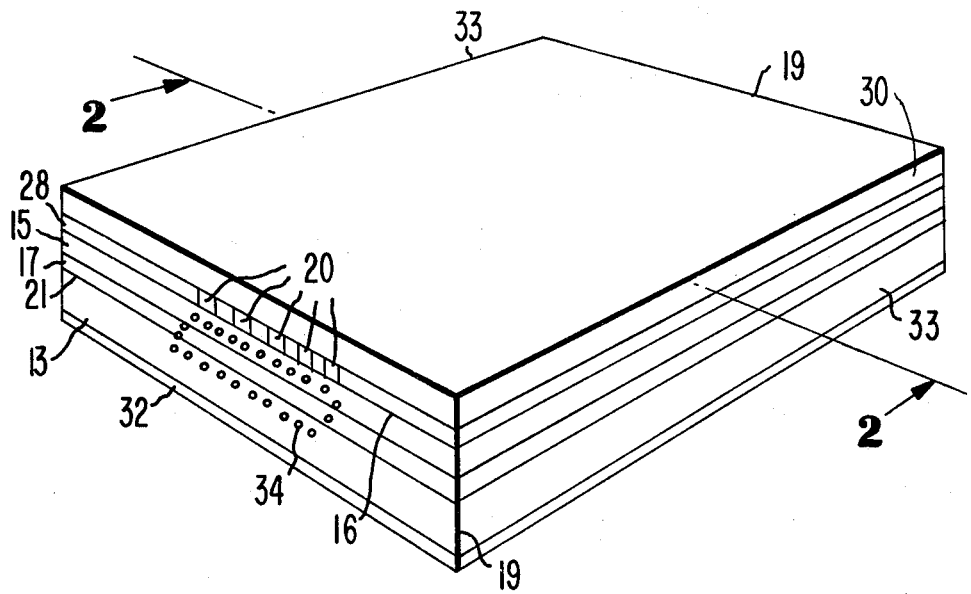
FIG. 1 is a perspective view of an electroluminescent semiconductor device with a stripe contact of the present invention.
Figure 2:
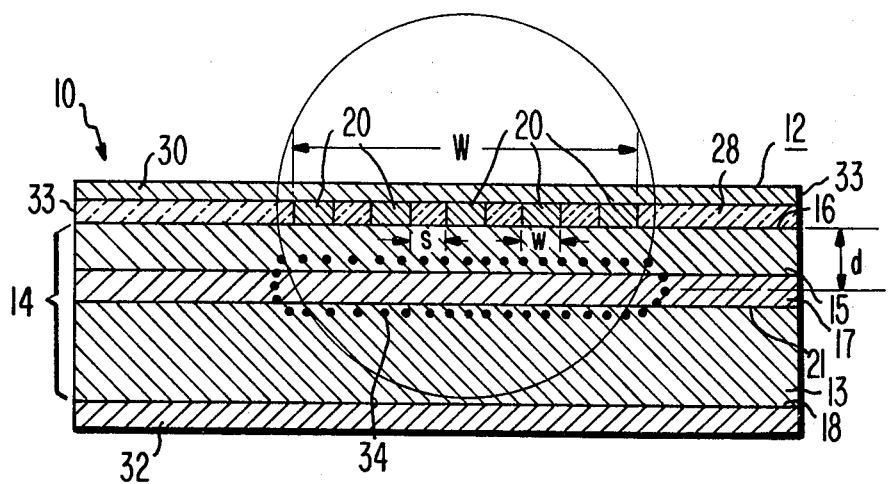
FIG. 2 is a cross-sectional view along the line 2—2 of FIG. 1.

Referring to FIGS. 1 and 2 a first embodiment of an electroluminescent semiconductor device, utilizing a stripe electrical contact of the present invention, is designated as 10. The stripe contact on a surface of the electroluminescent device 10 is designated as 12.

The electroluminescent device 10 is preferably a light emitting diode (LED) or a laser. For the purposes of explaining the present invention the device 10 is an LED. The electroluminescent device 10 includes a body 14 of semiconductor material which is capable of generating electroluminescence when biased with a voltage, such as the group III – V material and their alloys. The semiconductor body 14 has a pair of spaced contacting surfaces 16 and 18, respectively, opposed side surfaces 33, and opposed end surfaces 19. The contacting surfaces 16 and 18 are substantially perpendicular to the end surfaces 19. The end surfaces 19 are parallel to each other and one of the end surfaces 19 is transparent to light. Radiation generated in the body 14 is emitted at the end surface 19 which is light transparent.

The semiconductor body 14 has a first region 13 of one conductivity type, a second region 15 of the opposite conductivity type spaced from the first region 13 and a third region 17 of either conductivity type between and contiguous to the first and second regions 13 and 15. The first region 13 is at the contacting surface 18 and the second region 15 is at the contacting surface 16. The end surfaces 19 are surfaces common to the first, second and third regions 13, 15 and 17. For purposes of describing the present invention, the first region 13 is of a highly doped N type conductivity the second region 15 is of highly doped P type conductivity while the third region 17 is of P type conductivity of a lower concentration than the second region 15. Between the first and third regions 13 and 17 is a P-N junction 21, which is substantially perpendicular to the end surfaces 19. The third region 17 is of a semiconductor material such as gallium arsenide while the first and second regions 13 and 15 are of a semiconductor material such as aluminum gallium arsenide.

By stripe contact it is meant a contact whose electrical union to the body of a device is spaced from the side surfaces 33 of the body 14. The stripe contact 12 comprises a plurality of sub-stripes 20 individually in contact with and extending across the surface 16 of the body 14 between the end surfaces 19. The sub-stripes 20 are substantially parallel to each other, and are of a width "w" and spaced a distance "s" from each other along the end surfaces 19. Thus the sub-stripes 20 make a plurality of stripe-shaped unions with the contacting surface 16. Preferably, the sub-stripes 20 are of a metal having good adherence to and capable of providing ohmic contact to the semiconductor body 14. Typically, the sub-stripes 20 will be of a layer of chromium in intimate contact with the body 14 at the contacting surface 16 and a layer of gold on the layer of chromium. While the sub-stripes 20 are shown as being multilayered it is not necessary that they be multilayered, and it is anticipated by the present invention that they can be of only one layer of a metal having both good electrical and adherence properties.

The width of the stripe contact 12 along the end surfaces 19 from one outermost sub-stripe 20, i.e., the sub-stripe closest to a side surface 33, to the other outermost sub-stripe 20 is designated as "w."

Insulating material 28 is provided on the remaining portion of the surface 16 so as to extend between sub-stripes 20 and from the sub-stripes 20 to the sides 33. The insulating material 28 electrically isolates the sub-stripes 20 from each other. Typically the insulating material 28 is also characterized as having good heat dissipation qualities such as aluminum oxide, $Al_2O_3$, or silicon dioxide, $SiO_2$. It is anticipated by the present invention that the spaces between the sub-stripes 20 may be occupied by only air thereby electrically insulating the sub-stripes 20 from each other.

On the sub-stripes 20 and on the insulating material 28, is a contact layer 30. Although it is anticipated that the contact layer 30 may be on only the sub-stripes 20 and the insulating material between the sub-stripes 20. Preferably, the contact layer 30 is of the same metal or metals as the sub-stripes 20 and as will be explained subsequently, it is formed in the same fabrication step which forms the sub-stripes 20. The contact layer 30 is the common electrical connection to all the sub-stripes 20 such that all the sub-stripes 20 are electrically connected in parallel.

An electrode 32 is on the contacting surface 18 of the body 14. The electrode 32 can be of any electrically conductive metal which adheres well to and makes ohmic contact with the semiconductor material of the first region 13 of body 14. The electrode 32 can be multilayered, such as described with respect to the sub-stripes 20, or it can be of a single layer metal such as tin.

When the stripe contact 12 is positively biased and the electrode 32 is negatively biased a current will flow through body 14 from the contact 12 to the electrode 32. Since the stripe contact 12 makes electrical contact to only a portion of the contacting surface 16 while electrode 32 essentially makes electrical contact to all of the contacting surface 18, current will only flow through a portion of the third region 17.

In the area of the third region 17 through which the current flows, is a recombination region 34, enclosed by dots in FIGS. 1 and 2. The recombination region 34 is where electrons and holes recombine and generate electroluminescence. The distance from a geometric plane, which is in the center of the recombination region 34, to the contacting surface 16 is designated as "$d$." The plane in the center of the recombination region 34 is approximately perpendicular to the end surfaces 19 and approximately parallel to the contacting surfaces 16 and 18. However, since the thickness of the recombination region 34, between the first and second regions 13 and 15, is typically on the order of about 0.2 microns and the thickness of the second region 15, from contacting surface 16 to the recombination region 34, is typically of an order of 2.0 microns, the distance "$d$" is in essence the distance from the contacting surface 16 to the recombination region 34.

The function of the stripe contact 12 of the present invention is to provide a current flow of substantially uniform current density through the recombination region 34. A uniform current density in the recombination region 34 will provide uniform radiation generation in the recombination region 34. Specifically, the width "$w$" of the sub-stripes 20 and the spacing "$s$" between sub-stripes 20 are responsible for providing the current flow of uniform current density in the recombination region 34 of the device 10, as will subsequently be explained.

Figure 3:
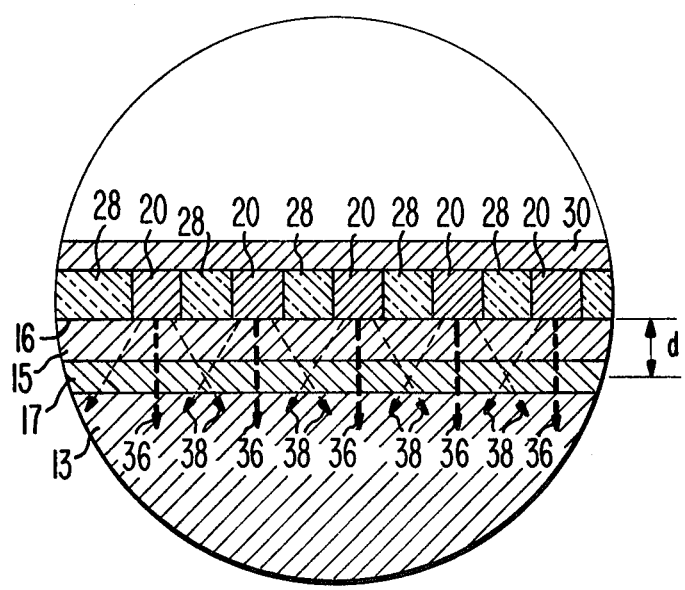
FIG. 3 is an enlarged view of the encircled portion of FIG. 2.

The general direction of the current flow from a sub-stripe 20 to the electrode 32 is designated by the bold dashed line 36 in FIG. 3. Also, line 36 designates the current path in the area of the center of the current flow pattern from a sub-stripe 20 to the electrode 32.

One factor which must be taken into account in determining the pattern of current flow from a sub-stripe 20 to electrode 32 is the conductivity, "$\sigma$" of the semiconductor material of the body 14. The higher the conductivity of the body 14 the more the current flow pattern flares out in the area of sub-stripes 20, from the direction of line 36. Referring to FIG. 3, the dashed line 38 represents the current path in the area of the periphery of the current flow pattern. The current depicted by line 38 is that portion of the current flow pattern which flares out away from the general current flow direction of line 36 and toward the general direction of the side surfaces 33. The current density of the current flow pattern of a sub-stripe 20 is highest in the area of the line 36, and the current density diminishes in the current flow pattern from the current at line 36 toward the current flaring out at line 38.

Once it is known how much the current flow will flare out as a result of the semiconductor material conductivity, "$\sigma$" and the distance "$d$" from the contacting surface 16 to the recombination region 34, it is then necessary to adjust the width "$w$" of the sub-stripes 20 and the spacing "$s$" between sub-stripes 20 so that the current that flows through the recombination region 34 is substantially uniform throughout the recombination region 34. By properly adjusting the width "$w$" and spacing "$s$" it is possible to have the current of the current flow pattern depicted by line 38, i.e., that current flaring out in each sub-stripe 20 current flow pattern, overlap the current in the area of line 38 of neighboring sub-stripes 20 so that the resulting current flow at the center of the recombination region 34 will be substantially uniform.

As an example of the dimensions of width "$w$" and spacing "$s$" needed for providing a uniform current density in the recombination region 34, if the semiconductor material of the recombination region 34 is of a conductivity "$\sigma$" in the range of 75 mho/cm and if the distance "$d$" from the center of the recombination region 34 to the contacting surface 16 is on the order of 2 microns, then width "$w$" and spacing "$s$" are each on the order of 5 microns.

In the fabrication of the stripe contact 12, after the body 14 of the electroluminescent device 10 has been fabricated by liquid or vapor phase epitaxy methods well known in the art, a layer of insulating material such as silicon dioxide is deposited by evaporation onto a surface of body 14. Then by photoresist and masking techniques well known in the art openings are etched into the insulating layer. The openings will subsequently be occupied by the sub-stripes 20, thus, they should be of the proper width "$w$" and spacing "$s$." Next, by means of evaporation techniques well known in the art, a metal or metals are deposited on the surface of body 14 at the openings and on the insulating layer for the formation of both the sub-stripes 20 and contacting layer 30. Also, by evaporation techniques electrode 32 is formed on the opposite surface of the body 14. Fabrication of the stripe contact 12 is completed by attaching contacting wires (not shown) to the contacting layer 30 and electrode 32 for external electrical connection.

While the present invention is described with the stripe contact 20 at the contacting surface 16, it is anticipated that the stripe contact can be at either of the contacting surfaces 16 or 18, with the electrode 32 on the opposite contacting surface.

Figure 4:
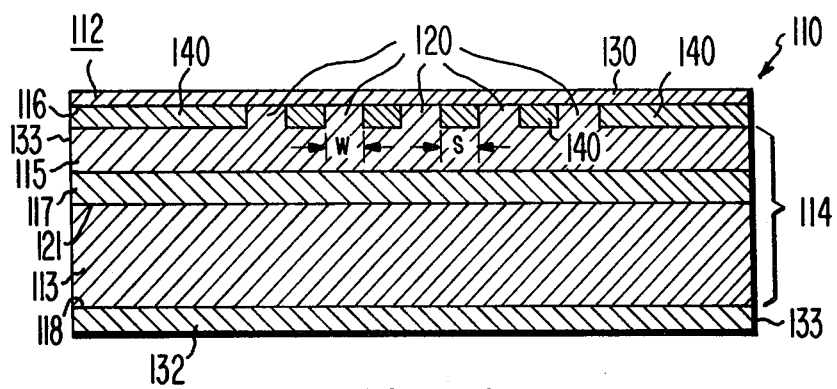
FIG. 4 is a cross-sectional view of a second embodiment of an electroluminescent semiconductor device with the stripe contact of the present invention.

Referring to FIG. 4, a second embodiment of the electroluminescent semiconductor device, which is an LED, utilizing the stripe electrical contact of the present invention is designated as 110. The stripe contact on the electroluminescent device 110 is designated as 112.

The electroluminescent device 110 includes a body 114 of semiconductor material capable of radiation generation when biased with a voltage. The body 114, like body 14 of the first embodiment, has a pair of contacting surfaces 116 and 118, opposed side surfaces 133 and opposed end surfaces 119, the same as contacting surfaces 16 and 18, opposed side surfaces 33 and opposed end surfaces 19 of the first embodiment. Also, the body 114 has a first region 113 and a second region 115 spaced from each other with a third region 117 between and contiguous to the first and second regions 113 and 115. The first and third regions 113 and 117 are the same as the first and third regions 13 and 17 of the first embodiment. As in the first embodiment it is assumed that the first region 113 is of a highly doped N-type conductivity, the second region 115 is of a highly doped P-type conductivity, but of a lower concentration than the second region 115. Between the first and third regions 113 and 117 is a P-N junction 121 like the P-N junction 21 of the first embodiment. On the contacting surface 118 is an electrode 132 the same as the electrode 32 of the first embodiment.

The second region 115 is like the second region 15 of the first embodiment except that there is a non-continuous electrically isolating layer 140, at the contacting surface 116 and in the second region 115. The non-continuous electrically isolating layer 140 is a portion of second region 115 which is either of a high resistivity and thus of an insulating quality to current flow, or of a conductivity type opposite to that of the second region 115 so that the junction between the second region 115 and the non-continuous layer 140 blocks the flow of current when the device 110 is biased.

The layer 140 is non-continuous in the area of the surface 116 spaced from the side surface 133. More specifically the continuity of the layer 140 is interrupted by a plurality of sub-stripes 120, which are regions of the semiconductor material of the second region 115 which will conduct electrical current. The sub-stripes 120 are of the same shape and size as the sub-stripes 20 of the first emobdiment but unlike the sub-stripes 20 the sub-stripes 120 are at the surface 116 and in the second region 115. Thus, the width of the sub-stripes 120 along the end surface 119 is "w." Like the sub-stripes 20 the spacing between neighboring sub-stripes 120, which is occupied by portions of the non-continuous layer 140, is of the dimension "s." Since the sub-stripes 120 are of the same material as the second region 115, the non-continuous layer 140 opposes current flow by either being of a higher resistivity or of an opposite conductivity than the sub-stripes 120.

On the non-continuous layer 140 and the sub-stripes 120 at the contacting surface 116 is a contact layer 130. The contact layer 130 is the same as the contact layer 30 of the first embodiment.

When the electroluminescent device 110 is biased, current flows through a recombination region 134 the same as the recombination region 34 of the first embodiment. The operation of the second embodiment of the present invention is the same as that of the first embodiment. In the second embodiment of the present invention current will only be able to enter the body of 114 of the device 110, where the sub-stripes 120 are in intimate contact with the contact layer 130. Thus, the sub-stripes 120 are analogous to the sub-stripes 20 in the operation of the device 110.

In the fabrication of the stripe contact 112, first the body 114 is fabricated by either liquid phase or vapor phase epitaxy methods well known in the art. Next, the non-continuous layer 140 and sub-stripes 120 are formed by techniques well known in the art. A mask is placed on that portion of the surface 116 where there is to be the sub-stripes 120. The surface 116 is the proton bombarded resulting in the forming of the non-continuous layer 140 of a high electrical resistivity. Where the mask protected the surface 116 from proton bombardment are the sub-stripes 120.

An alternative process for forming the non-continuous layer 140 and sub-stripes 120 requires diffusion techniques well known in the art. Again a mask is placed on the contacting surface 116 where it is desirable to have the sub-stripes 120. Then by diffusion techniques the body 114 is doped with conductivity modifiers, except for that area which is masked. The dopant is of a conductivity type opposite to that of the second region 115. That portion of the second region 115 into which the dopant is diffused is the non-continuous layer 140. Where the second surface 118 was masked are the sub-stripes 120. After the non-continuous region 140 and sub-stripes 120 are formed the contacting layer 130 and electrode 132 are formed by state of the art evaporation techniques. Fabrication of the electroluminescent device 110 is completed by attaching conducting wires (not shown) to the contact layer 130 and electrode 132.

The first and second embodiments of the stripe contact of the present invention provides a current flow of substantially uniform current density in the recombination region of electroluminescent semiconductor devices.

We claim:

1. An electroluminescent semiconductor device comprising:
   a body of semiconductor material having opposed parallel end surfaces, opposed side surfaces, a pair of spaced contacting surfaces substantially perpendicular to said end surfaces, and a recombination region in which radiation can be generated; and
   a stripe contact at one of said contacting surfaces having a plurality of spaced, parallel sub-stripes individually contacting said body extending from one end surface to the other, with the width and spacing between said sub-stripes along said end surfaces being such as to provide a substantially uniform current density through said recombination region.

2. The electroluminescent semiconductor device in accordance with claim 1 wherein said sub-stripes are in spaced relationship on the contacting surface and a contact layer is on said sub-stripes and electrically connects the sub-stripes in parallel.

3. The electroluminescent semiconductor device in accordance with claim 2 including insulating material extending between said sub-stripes and from said sub-stripes to said side surfaces, and the contact layer is on said sub-stripes and insulating material.

4. The electroluminescent semiconductor device in accordance with claim 1 wherein said sub-stripes are at the contacting surface and in the body, with a non-continuous electrically isolating layer occupying that portion of said body at the contacting surface not occupied by said sub-stripes, and a contact layer on the sub-stripes and non-continuous layer at the contacting surface.

5. The electroluminescent semiconductor device in accordance with claim 4 wherein said non-continuous isolating layer is of a much higher resistance to current flow than said sub-stripes.

6. The electroluminescent semiconductor device in accordance with claim 5 wherein said non-continuous isolating layer is of an opposite conductivity than said sub-stripes.

* * * * *